US008895337B1

United States Patent
Wang et al.

(10) Patent No.: US 8,895,337 B1
(45) Date of Patent: Nov. 25, 2014

(54) METHOD OF FABRICATING VERTICALLY ALIGNED GROUP III-V NANOWIRES

(71) Applicant: Sandia Corporation, Albuquerque, NM (US)

(72) Inventors: George T. Wang, Albuquerque, NM (US); Qiming Li, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 51 days.

(21) Appl. No.: 13/743,433

(22) Filed: Jan. 17, 2013

Related U.S. Application Data

(60) Provisional application No. 61/588,446, filed on Jan. 19, 2012.

(51) Int. Cl.
*H01L 21/00* (2006.01)
*H01L 33/04* (2010.01)
*B82Y 40/00* (2011.01)

(52) U.S. Cl.
CPC .............. *H01L 33/04* (2013.01); *B82Y 40/00* (2013.01); *Y10S 977/762* (2013.01); *Y10S 977/888* (2013.01)
USPC .............. 438/47; 438/22; 438/46; 438/481; 257/E33.015; 257/E33.023; 257/E29.005; 257/E29.089; 977/762; 977/888

(58) Field of Classification Search
USPC ............ 438/47, 48, 483; 257/13–21, 98, 255, 257/615, E21.461, E27.059, E29.089; 977/700–762
See application file for complete search history.

(56) References Cited

U.S. PATENT DOCUMENTS

| | | |
|---|---|---|
| 8,350,249 B1 | 1/2013 | Svensson |
| 2006/0102916 A1* | 5/2006 | Sun et al. .................. 257/98 |
| 2006/0223211 A1* | 10/2006 | Mishra et al. .................. 438/41 |
| 2008/0036038 A1 | 2/2008 | Hersee et al. |
| 2009/0079034 A1* | 3/2009 | Wang ...................... 257/615 |
| 2010/0163840 A1 | 7/2010 | Seifert et al. |
| 2010/0304204 A1 | 12/2010 | Routkevitch et al. |
| 2011/0126891 A1 | 6/2011 | Goto et al. |
| 2011/0240959 A1 | 10/2011 | Konsek et al. |
| 2011/0309382 A1 | 12/2011 | Lowgren |
| 2012/0001239 A1* | 1/2012 | Ko et al. .................. 257/255 |
| 2012/0097232 A1 | 4/2012 | Kim et al. |
| 2012/0235117 A1* | 9/2012 | Fukui et al. .................. 257/13 |
| 2013/0161643 A1* | 6/2013 | Crowder et al. .................. 257/76 |

FOREIGN PATENT DOCUMENTS

WO    2011005013 A2    1/2011

OTHER PUBLICATIONS

Wang, C.Y. et al., "GaN nanorod light emitting diode arrays with a nearly constant electroluminescent peak wavelength", Optics Express, 2008, pp. 10549-10556, vol. 16, No. 14.

Chiu, C.H. et al., "Fabrication of InGaN/GaN nanorod light-emitting diodes with self-assembled Ni metal islands", Nanotechnology, 2007, pp. 445201, vol. 18.

(Continued)

*Primary Examiner* — Charles Garber
*Assistant Examiner* — Abdulfattah Mustapha
(74) *Attorney, Agent, or Firm* — Kevin W. Bieg

(57) ABSTRACT

A top-down method of fabricating vertically aligned Group III-V micro- and nanowires uses a two-step etch process that adds a selective anisotropic wet etch after an initial plasma etch to remove the dry etch damage while enabling micro/nanowires with straight and smooth faceted sidewalls and controllable diameters independent of pitch. The method enables the fabrication of nanowire lasers, LEDs, and solar cells.

34 Claims, 10 Drawing Sheets

(56) References Cited

OTHER PUBLICATIONS

Li, Qiming et al., "Optical performance of top-down fabricated InGaN/GaN nanorod light emitting diode arrays", Optics Express, 2011, pp. 25528-25534, vol. 19, No. 25.

Li, Qiming et al., "Dislocation density reduction in GaN by dislocation filtering through a self-assembled monolayer of silica microspheres", Applied Physics Letters, 2009, pp. 231105-1-231105-3, vol. 94.

Wang, Y. D. et al., "High optical quality GaN nanopillar arrays", Applied Physics Letters, 2005, pp. 071917-1-071917-3, vol. 86.

Miller, M. A. et. al., "Smooth and Vertical Facet Formation for AlGaN-Based Deep-UV Laser Diodes", Journal of Electronic Materials, 2009, pp. 533-537, vol. 38.

Stocker, D. A. et al., "Crystallographic wet chemical etching of GaN", Applied Physics Letters, 1998, pp. 2654-2656, vol. 73, No. 18.

Wang, G.T. et al., "III-nitride nanowires: Novel materials for solid-state lighting", Proc. of SPIE, vol. 7954, 2011, pp. 79540T-1-79540T-9.

Wierer, J.J. et al., "III-nitride core-shell nanowire arrayed solar cells", Nanotechnology vol. 23, 2012, 194007, pp. 1-6.

* cited by examiner

METHOD OF FABRICATING VERTICALLY ALIGNED GROUP III-V NANOWIRES

CROSS-REFERENCE TO RELATED APPLICATIONS

This application claims the benefit of U.S. Provisional Application No. 61/588,446, filed Jan. 19, 2012, which is incorporated herein by reference. This application is related to U.S. application Ser. No. 13/434,646, filed Mar. 29, 2012, and SD12195, titled "Amber Light-Emitting Diode Comprising a Group III-Nitride Nanowire Active Region," filed of even date with this application, both of which are incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to compound semiconductor micro/nanowire arrays and, in particular, to a top-down method of fabricating vertically aligned Group III-V micro- and nanowires.

BACKGROUND OF THE INVENTION

Improving the performance of Group III-nitride (e.g., AlGaInN) based devices, including light-emitting diodes (LEDs), has been the intense focus of research and development efforts worldwide. While current LEDs are based on planar thin-film architectures, vertically aligned nanowires (also called nanorods or nanocolumns) are being explored as an alternative architecture. Several advantages of nanowire-based devices and LEDs have been recently reported. For example, nanowire-based LEDs can enhance light extraction due to light scattering, optical mode elimination, and efficient light out-coupling. See C. H. Kuo et al., *IEEE Photonics Technology Letters* 22, 257 (2010). Strain-relaxed, bottom-up nanowire growth also enables high crystalline quality with significantly reduced threading dislocation densities. See S. D. Hersee et al., *Nano Lett.* 6, 1808 (2006). Higher indium compositions, which are desired for longer green-red wavelength emission, can be achieved with nanowires because of their compliance properties and strain relief mechanisms. See Q. M. Li and G. T. Wang, *Appl. Phys. Lett.* 97, 181107 (2010); and T. Kuykendall et al., *Nature Mater.* 6, 951 (2007). Variability in the emission wavelengths across nanowires within an ensemble can lead to phosphor-free "white" LEDs. See H. W. Lin et al., *Appl. Phys. Lett.* 97, 073101 (2010); and H. Sekiguchi, K. Kishino, and A. Kikuchi, *Appl. Phys. Lett.* 96, 231104 (2010). Additionally, suppressed quantum confined Stark effect (QCSE) and reduced droop in InGaN/GaN nanowires have also been reported. See C. Y. Wang et al., *Opt. Express* 16, 10549 (2008); and H. P. T. Nguyen et al., *Nano Lett.* 11, 1919 (2011). Finally, the geometry of nanowires allows them to act as lasing cavities, enabling nanosized lasers.

Growth of InGaN/GaN-based nanowire LEDs by bottom-up methods, including hydride vapor phase epitaxy and molecular beam epitaxy, have been demonstrated. See H.-M. Kim et al., *Nano Lett.* 4, 1059 (2004); H. W. Lin et al., *Appl. Phys. Lett.* 97, 073101 (2010); H. P. T. Nguyen et al., *Nano Lett.* 11, 1919 (2011); and K. Kishino et al., "InGaN/GaN nanocolumn LEDs emitting from blue to red—art. no. 64730T," in *Gallium Nitride Materials and Devices II*, H. L. C. W. Morkoc, ed. (SPIE, Bellingham, Wash., 2007), pp. T4730-T4730. However, relatively low growth temperature and low V to III ratio are commonly used to promote anisotropic one-dimensional crystal growth. Metal catalyzed-grown nanowires also require narrow growth conditions which involves lower than optimal growth temperatures. See G. T. Wang et al., *Nanotechnology* 17, 5773 (2006). These growth conditions may introduce higher impurities and point defect densities than the conditions used for creating commercial-quality planar LEDs and provide less flexibility for adjusting growth parameters to optimize doping concentrations and other desired material properties. See A. A. Talin et al., *Appl. Phys. Lett.* 92, 093105 (2008); and P. C. Upadhya et al., *Semiconductor Science and Technology* 25, 024017 (2010).

In contrast, nanowires fabricated by top-down methods are etched from planar thin film structures grown under optimized growth conditions, obviating these disadvantages. Tapered, non-faceted InGaN-based nanowire LEDs have been previously demonstrated by plasma etching planar LED structures. See C. Y. Wang et al., *Opt. Express* 16, 10549 (2008); and C. H. Chiu et al., *Nanotechnoloqv*, 445201 (2007). However, the top-down plasma etching leads to damaged, rough, and non-faceted sidewalls with defects, and leakage currents that limits performance. See C. Y. Wang et al., *Opt. Express* 16, 10549 (2008).

Therefore, the present invention is directed to a top-down method for fabricating vertically aligned Group III-V micro- or nanowires using a two-step etch process that adds a selective anisotropic wet etch after an initial plasma etch to remove the dry etch damage while enabling micro- and nanowires with straight and smooth faceted sidewalls and controllable diameters independent of pitch.

SUMMARY OF THE INVENTION

The present invention is directed to a method to fabricate vertically aligned Group III-V nanowires, including Group III-N nitride (III-N) or AlGaInN nanowires. The method enables the fabrication of micro/nanowire-based devices, such as nanowire LED arrays, lasers, and solar cells from planar epitaxial or bulk structures. In contrast to previous work, this top-down method combines the plasma etch with a subsequent wet etch, which allows for removal of the plasma etch damage, while enabling straight nanowire sidewalls and control over the nanowire geometry. The resulting nanowire structures are virtually free of dislocations, depending on the dislocation density of the initial material the nanowires are etched from.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 4(d) is a scanning transmission electron microscopy (STEM) image of nanowire "flashlight" LEDs showing the position of the InGaN MQWs (bright stripes).

FIG. 7(c) is a graph of MQW PL peak position plotted as a function of pump power for planar LEDs and nanowire LEDs.

DETAILED DESCRIPTION OF THE INVENTION

The present invention is directed to a method of fabricating vertically aligned Group III-V micro- or nanowires. The method comprises providing a Group III-V substrate or at least one Group III-V layer on a growth substrate; coating the top surface of the Group III-V substrate or layer with an etch mask; anisotropically etching (e.g., via dry etching) the Group III-V substrate or at least one layer through the etch mask and removing the etch mask to provide an array of nanowires; and selectively wet etching the sidewalls of the nanowires to remove anisotropic etch damage and provide an array of vertically aligned Group III-V nanowires. The nanowires can have a variety of cross sections depending on the etch chemistry, including circular. The wire diameters and lengths can be controlled by the etch times. The method is scalable from nanowire cross-sectional dimension (e.g., diameter) of approximately 5 nm to 100 microns. Therefore, the terms microwire, nanowire, and micro/nanowire are used interchangeably herein. Further, the term micro- or nanowire can be used interchangeably with the terms nanocolumn, nanopillar, or nanorod, or micro-variations thereof. The Group III-V compound semiconductor can comprise one or more Group III element, such as aluminum, gallium, or indium, and one or more Group V element, such as antimony, arsenic, phosphorous, or nitrogen. For example, the Group III-V compound semiconductor can be a Group III-nitride, as described in further detail in the examples below. However, the method can be generalized to other Group III-V semiconductors by modifying the etch chemistries. For Group III-nitrides, the growth substrate can comprise sapphire. However, other Group III-V compatible growth substrates can also be used, such as silicon, germanium, copper, silicon carbide, GaN, AlN, ZnO, or GaAs. The etch mask can comprise a hexagonally close-packed silica colloid monolayer. However, many other types of etch masks can also be used, such as a lithographically patterned dielectric or metal layer. In one embodiment, following etching of the nanowires, co-axial shell layers can be grown around the vertically aligned nanowire cores to create radial heterostructure nanowires for devices, such as LEDs and solar cells.

Figure 1:
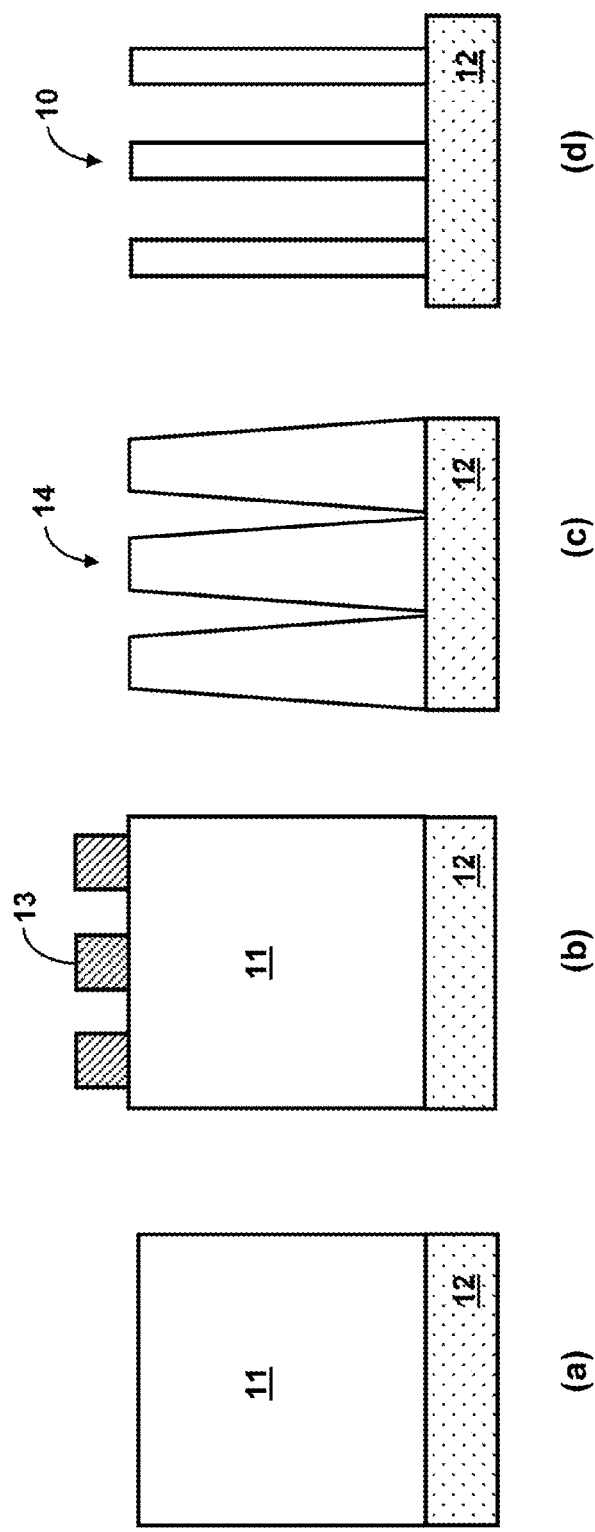
FIG. 1 is a schematic illustration of a method to fabricate vertically aligned nanowires.

One embodiment of the invention, shown in FIG. 1, is directed to a method of fabricating an array of vertically aligned Group III-V nanowires 10. This embodiment comprises providing a Group III-V layer 11 on a substrate 12; coating the Group III-V layer 11 with an etch mask 13; plasma etching the Group III-V layer 11 through the etch mask 13 and removing the etch mask to provide a semi-periodic array of tapered nanowires 14; and selectively wet etching the sidewalls of the tapered nanowires 14 to provide an array of vertically aligned Group III-V nanowires 10. This method enables precise control over the nanowire geometry.

Figure 2:
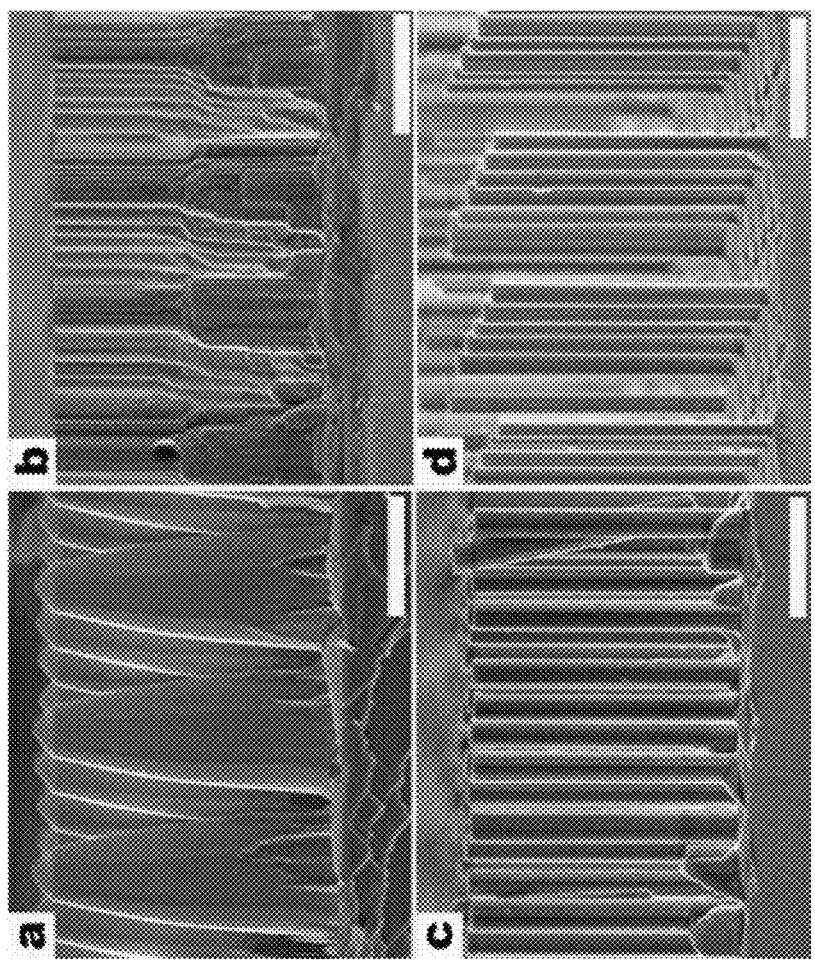
FIGS. 2(*a*)-2(*d*) are cross sectional SEM images showing GaN posts morphology transiting into GaN nanowires. All images have the same magnification. Scale bars are 2 μm.

As an example of this embodiment, described below is a top-down fabrication method which produced uniform and vertically aligned GaN nanowire arrays from c-plane GaN epilayers on sapphire with low defect density and smooth sidewalls. FIGS. 2(a)-(d) shows SEM images of the top-down GaN nanowires during the fabrication process. Starting from Si-doped planar GaN epilayers grown on 2" c-plane sapphire wafers in a metal organic chemical vapor deposition reactor, a 2-step etching process was used: a lithographic dry etch followed by an anisotropic wet etch. Following a process reported by Reculusa and Ravaine, a monolayer of 3 μm diameter silica colloids was self-assembled on the GaN surface in a Langmuir-Blodgett trough prior to etching to serve as a semi-periodic lithographic etch mask. See S. Reculusa and S. Ravaine, *Chem. Mater.* 15, 598 (2003). GaN posts were subsequently formed by a plasma (dry) etch. As shown in FIG. 2(a), the resulting posts were tapered with large cross-section areas. Moreover, ion bombardment during the plasma etch damaged the nanowire surface, as evidenced by a significant increase in yellow luminescence. See Q. M. Li et al., *Opt. Express* 19, 25528 (2011). These issues were resolved during the second (wet) etch step. FIGS. 2(b)-2(d) show SEM images of the posts after 2 hours, 6 hours, and 9 hours from the start of the wet etch. With the anisotropic wet-etch step, non-tapered GaN nanowires were created with damage-free surfaces, hexagonal cross sections with m-plane {10-10} sidewall facets, and a top c-plane (0001) resonator (end) facet. The GaN nanowire length was determined by the original GaN epilayers thickness and its width was determined by the duration of the wet-etch. For example, such GaN nanowires can be used to provide single-mode GaN nanowire laser. See Q. Li et al., *Optics Express* 20, 17873 (2012).

Figure 3:
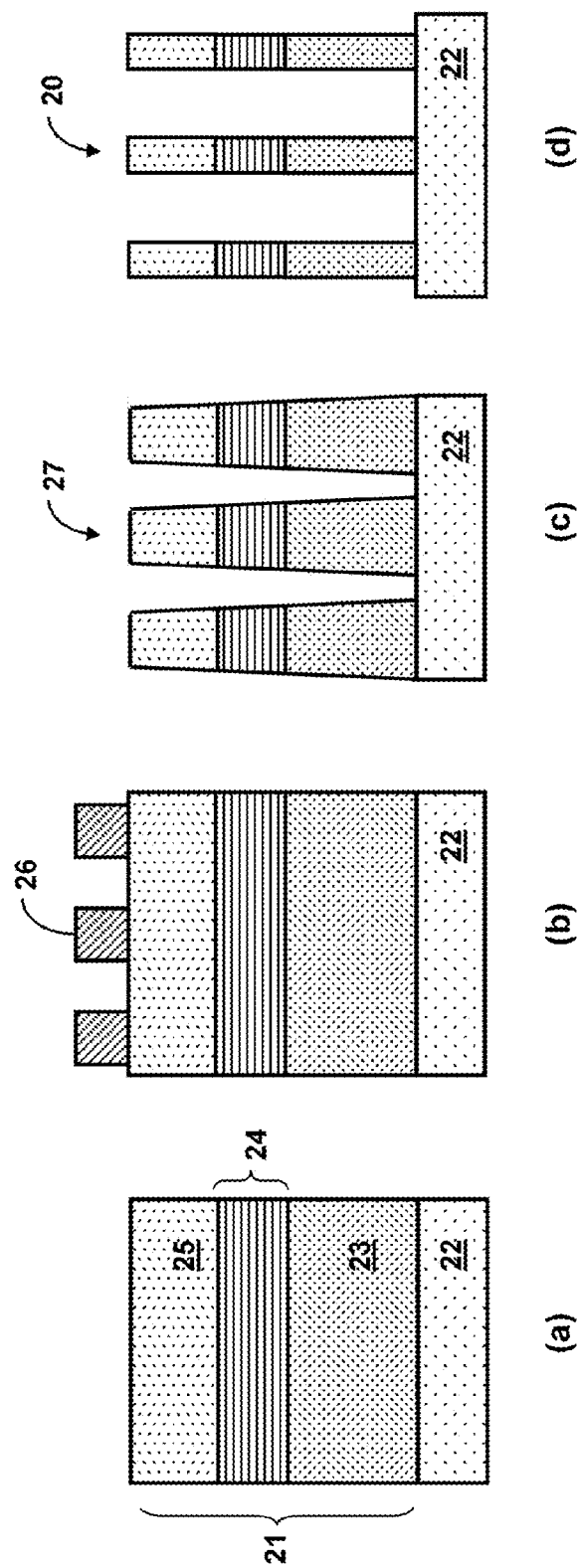
FIG. 3 is a schematic illustration of a method to fabricate vertically aligned nanowires having a lighting-emitting diode (LED) structure.

In another embodiment, shown in FIG. 3, the at least one Group III-V layer comprises a lighting-emitting diode (LED) structure. As shown in FIG. 3(a), the LED structure 21 can comprise a base n-type layer 23 on a substrate 22, a planar multiple quantum well (MQW) heterostructure 24 on the base n-type layer 23, and a top p-type layer 25 on the quantum well structure 24. As shown in FIG. 2(b), the LED structure 21 can then be covered with an etch mask 26. As shown in FIG. 3(c), the planar LED structure 21 can then be dry plasma-etched through the etch mask 26 and the etch mask removed to provide a semi-periodic array of truncated tapered (e.g., cone-shaped) nanowires 27. Finally, as shown in FIG. 3(d), the sidewalls of the tapered nanowires 27 can be anisotropically wet etched to remove the plasma etch damage and provide vertically aligned Group III-V nanowires 20. Alternatively, vertically aligned Group III-V nanowires can be made using an inverted heterostructure comprising a base p-type layer and a top n-type layer. Alternatively, rather than using a base n- or p-type layer on a growth substrate, a n- or p-type bulk substrate can also be used. The Group III-V structure can comprise a Group III-nitride structure, such as GaN, AlN, AlGaN, InN, InGaN, or AlInGaN that is undoped, n-type doped, or p-type doped. Other Group III-V structures, such as AlInGaAs or AlInGaP, can also be used.

As an example of this embodiment, the LED structure can comprise an n-type GaN base layer on a sapphire substrate, a planar InGaN-based MQW structure on the n-type GaN base layer, and a top p-type GaN layer on the MQW structure. Accordingly, a prototypical InGaN/GaN MQW planar LED structure was first grown on c-plane sapphire in a metal organic chemical vapor deposition reactor. The LED structure consisted of a 2.5 μm thick Si-doped n-type GaN layer grown at 1050° C. followed by a 5-period MQW comprised of 2.5 nm thick $In_{0.13}Ga_{0.87}N$ wells and 7.2 nm thick GaN barriers grown at 770° C. In addition, a 22 nm thick p-$Al_{0.2}Ga_{0.8}N$ layer and a 200 nm thick p-type GaN contact layer were grown sequentially after the MQWs. After the growth, a close-packed monolayer of 1 μm diameter silica spheres was self-assembled on the GaN surface in a Langmuir-Blodgett trough as previously reported. See Q. Li et al., *Appl. Phys. Lett.* 94, 231105 (2009). The silica colloid monolayer functions as a mask in a subsequent inductively coupled plasma etch. Previously, plasma etching has been used to create GaN nanowires and GaN-based LED nanowires using various etch masks. See Y. D. Wang et al., *Appl. Phys. Lett,* 86, 071917 (2005); C. Y. Wang et al., *Opt. Express* 16, 10549 (2008); and C. H. Chiu et al., *Nanotechnoiogy,* 445201 (2007). The plasma etch step was followed with a selective KOH-based wet etch (AZ400K photoresist developer, AZ Electronic Materials USA Corp). See M. A. Miller et al., *J. Electron. Mater.* 38, 533 (2009); and D. A. Stocker et al., *Appl. Phys. Lett,* 73, 2654 (1998). With this etchant, the top Ga-polar c-plane surface has a near-zero etch rate while the {10-10} m-plane sidewalls have a relatively fast etch rate compared to the other planes. As a result, the height of nanowire LEDs remains constant and the tapered sidewalls are eventually replaced with six straight and smooth m-plane sidewalls. The nanowire LED array and the original planar LED control sample were characterized by scanning electron microscopy (SEM), x-ray diffraction (ACRD), transmission electron microscopy (TEM), and temperature (4K-298K) and pump power dependent photoluminescence (PL).

Figure 4:
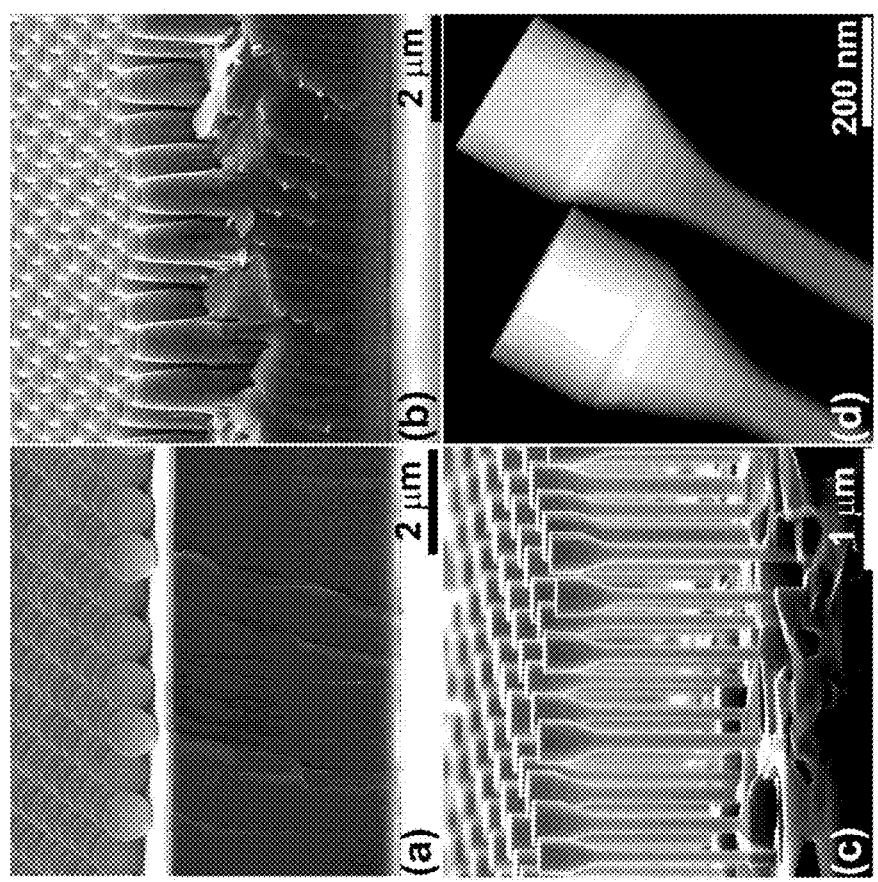
FIG. 4 are scanning electron microscopy (SEM) images of (a) a planar LED wafer covered with a monolayer of self-assembled silica spheres, (b) tapered nanowire LEDs created by plasma etch, and (c) "flashlight" shaped nanowire LEDs array following wet etch.

FIG. 4(*a*) is a SEM image of a planar LED structure covered with a hexagonal close-packed monolayer of silica spheres. After plasma etching, truncated cone-shaped nanowires were formed, as shown in FIG. 4(*b*). After the anisotropic wet etch using AZ400K, nanowires with straight and smooth sidewalls were produced, as shown in FIG. 4(*c*). The n-type GaN etches more quickly than the p-type GaN, leading to "flashlight" or "golf-tee" shaped nanowire LEDs, as shown in FIGS. 4(*c*) and 4(*d*). Previously, p-type GaN has been reported to be resistant to photoelectrochemical etching, as photogenerated holes needed for oxidation of the surface are swept away from the depletion region near the surface into the bulk. See D. Zhuang, and J. H. Edgar, *Mater. Sol. Eng. R-Rep.* 48, 1 (2005). While the etch process of the present invention is neither photo-nor electrically assisted, it is possible that the presence of holes at the surface or the different surface potential between n-type and p-type GaN is responsible for the difference in wet etch rates observed here. See S. Barbet et al., *Appl. Phys. Lett.* 93, 212107 (2008).

Figure 5:
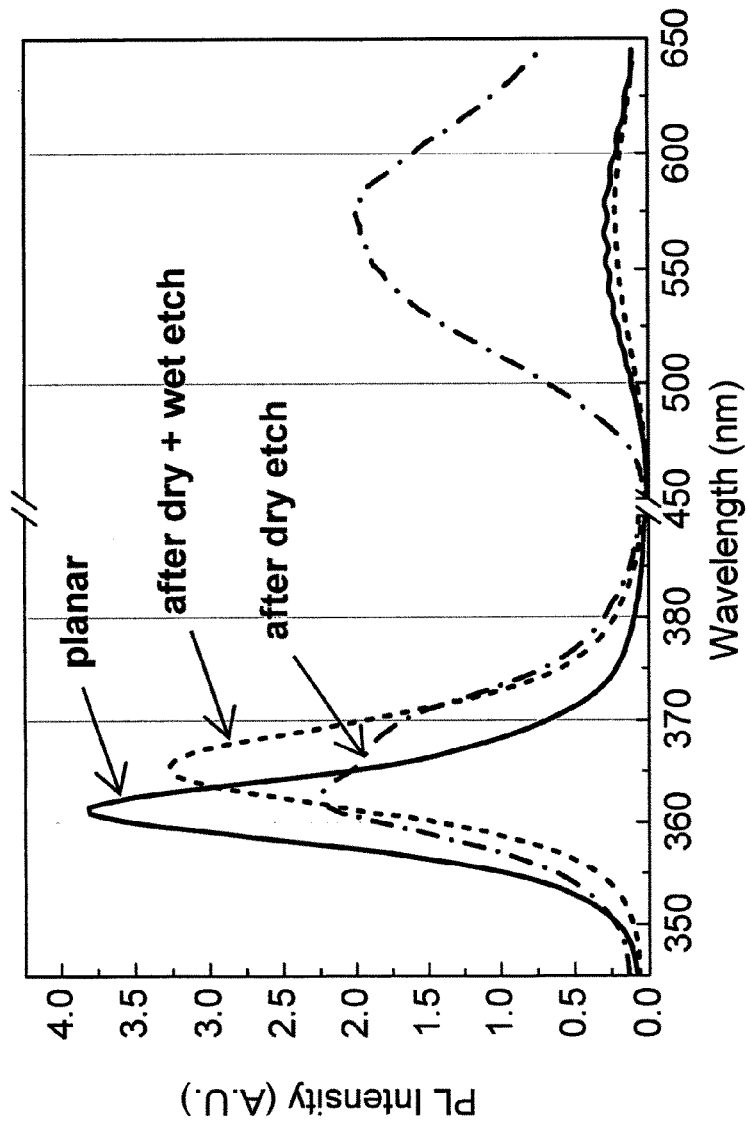
FIG. 5 are photoluminescence (PL) spectra of GaN thin film (solid) and GaN nanowires after plasma etch (dashed-dotted) and subsequent wet etch (dotted).

In addition to allowing for control of the nanowire geometry, the wet etch step also serves to remove damage in the nanowire sidewalls caused by high energy ion bombardment during the plasma etch. This ion damage was reported to cause a Ga-rich surface in GaN films with efficient nonradiative recombination centers and a deterioration in PL intensity. See H. W. Choi et al., *Appl. Phys. Lett.* 77, 1795 (2000); and Y. K. Byeun et al., *J. Ceram. Process. Res.* 6, 197 (2005). Moreover, vacancies may form near the surface region and trap or scatter carriers leading to high static resistance and reduced carrier mobility. See S. J. Chua et al., *Phys. Rev. B* 64, 205302 (2001). Room-temperature PL (266 nm pump) indicates a strong defect-related yellow luminescence from GaN nanowires etched from a GaN epilayer after the plasma etch, as shown in FIG. 5. However, after subsequent wet etching the nanowire samples in AZ400K, the yellow luminescence intensity was significantly reduced to a level similar to that of the planar GaN thin film prior to the plasma etch. This result unambiguously shows the wet etch step successfully removes the damage caused by the plasma etch. The slight red shift of the band edge luminescence in the nanowire samples compared to the planar sample may be a result of laser-induced heating effects caused by poorer thermal transport properties. See H. W. Li et al., *Adv. Mater.* 18, 216 (2006). However, drawing conclusions based on comparing the absolute band edge and yellow intensities of the samples is difficult, as various factors can impact the PL intensities. For example, the nanowire samples likely experience enhanced pump laser absorption and higher light extraction efficiencies, but have only a small fraction of the original volume of the planar sample. However, the relative contribution of each of these factors cannot be deconvolved.

Figure 6:
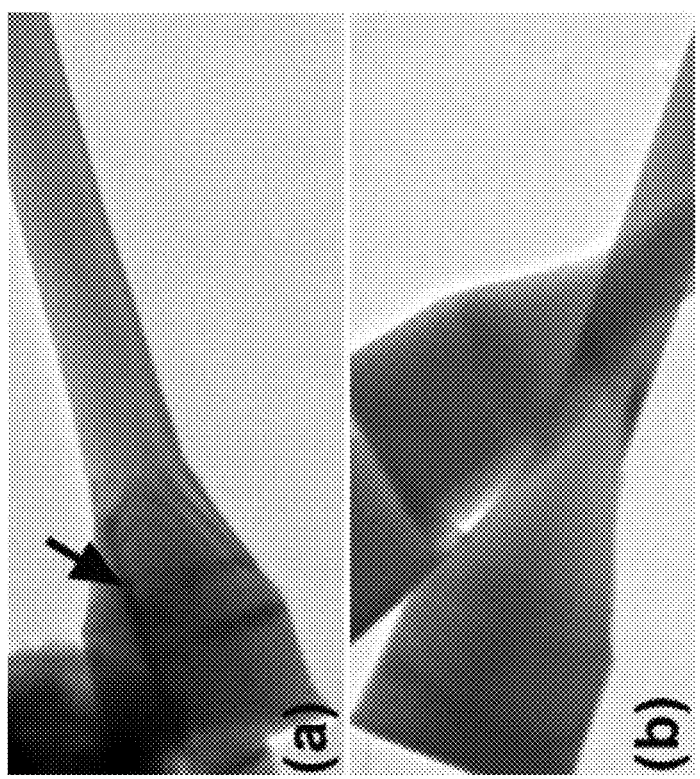
FIGS. 6(a) and 6(b) are transmission electron microscopy (TEM) images of etched nanowire LED structures. A dislocation is indicated by the arrow in FIG. 6(a).

Bright-field TEM imaging was performed to study the dislocation morphology of the nanowires under multi-beam conditions to reveal dislocations with different Burger's vectors. Typical TEM images are shown in FIGS. 6(*a*) and 6(*b*). TEM imaging of 100 randomly sampled nanowires revealed that 94 nanowires were free of threading dislocations. The threading dislocation density in the initial planar LEDs epilayers before etching was measured to be ~5 dislocations/$\mu m^2$ ($5 \times 10^8$ $cm^{-2}$), which is typical for commercial quality LEDs. Thus, for nanowire diameters ~150 nm (with cross-sectional area ~0.02 pre), the average number of dislocations per nanowire was ~0.1. In reality, each nanowire either had one or more dislocations or was dislocation free. Therefore, unlike bulk LEDs, which have a distribution of dislocations throughout, a nanowire LED array is comprised of individual LED elements which are largely dislocation-free. This nearly dislocation-free nanowire architecture can, compared to planar LEDs, have lower leakage currents, less non-radiative recombination, higher IQE, and higher lifespan. This result also shows that nanowires formed by top-down etching can be nearly dislocation free even though they are not grown strain-relaxed like bottom-up nanowires.

Figure 7:
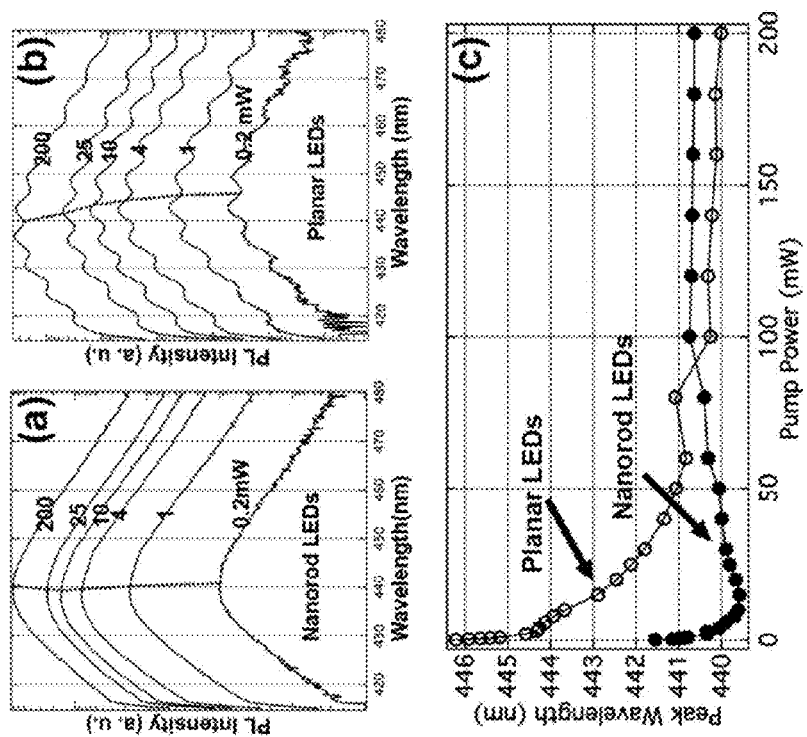
FIG. 7 are multiple quantum well (MQW) PL of (a) nanowire LEDs and (b) planar LED.

The room temperature PL spectra of the nanowire LED InGaN MQWs excited by a 413.1 nm Krypton ion laser are compared to the planar LED in FIGS. 7(*a*) and 7(*b*). The PL spectra peak positions were determined using Gaussian fit and plotted as a function of pumping power in FIG. 7(*c*). For both structures there is a blue shift in the emission wavelength with pump power (carrier injection) caused by free carrier screening of the QCSE. The QCSE results from spontaneous polarization field caused by low symmetry of c-plane III-nitride crystal structure and piezoelectric polarization field caused by lattice mismatch strain at InGaN/GaN interfaces. These internal fields may lower the IQE by reducing carrier wavefunction overlap. By comparing (0002) ω/2θ XRD scans taken before and after nanowire etching and by applying an appropriate elasticity theory analysis, it was estimated that the coherency strain of the individual InGaN QWs was reduced by 16±4% because of the elastic response enabled by nanowire formation. A further comparison of the planar sample's emission at low power (445 nm) to the bulk bandgap of $In_{0.13}Ga_{0.87}N$ (426 nm) indicated a QW Stark shift in the planar sample of ~19 nm. See J. Wu et al., *Appl. Phys. Lett.* 80, 4741 (2002). Assuming that the change in strain linearly alters the piezoelectrically dominated Stark shift, a ~3.0 nm blue shift (0.16×19 nm) for the nanowire QW emission was estimated relative to that of the planar sample. In FIG. 7(c) is shown a measured blue shift of ~4 nm (from about 445 to 441 nm for the planar vs. nanowire sample) at low power, in approximate agreement with the estimates and in support of partial QW strain relaxation due to wire formation. A smaller maximum blue shift of ~2 nm in the nanowire InGaN peak position as the pumping power was increased from 0 to 100 mW compared to the 6 nm shift observed in the planar LED is also evidence for reduced QCSE in the nanowire LEDs, consistent with a previous report. See C. Y. Wang et al., *Opt. Express* 16, 10549 (2008).

Figure 8:
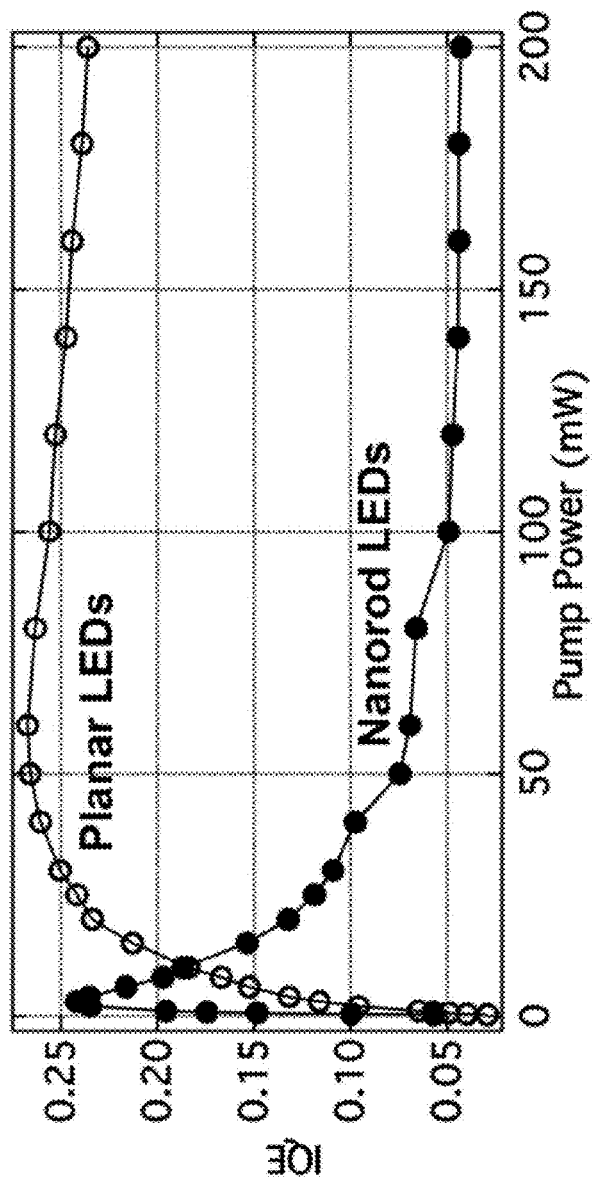
FIG. 8 is a graph of internal quantum efficiency (IQE) of the planar and nanowire LEDs plotted as a function of the optical pumping power.

Due to the reduction in the piezoelectric polarization fields and relative lack of dislocations, the internal quantum efficiency of the nanowire LEDs might be expected to improve compared to the planar LED. As shown in FIG. 8, the IQE of the nanowire and planar LEDs were measured by comparing their integrated PL intensity at room temperature with the maximum intensity measured at 4° K and assuming unity IQE at 4° K. Due to increased light scattering and light absorption, the nanowire LEDs likely experience a much higher equivalent pumping intensity (carrier concentration) at a given laser power compared to the planar sample, leading to the early peaking of the IQE. The IQE of the nanowire LEDs peaks at ~3 mW, (~24%), while the planar LED reaches its maximum IQE of ~27%, at a much higher pump power of ~55 mW. The peak IQEs are comparable so the formation of the nanowires did not compromise the IQE in an overly detrimental way. Additionally, it is possible that the decrease in IQE in the nanowire LEDs at relatively low pump powers may be caused by heating from the laser, due to the poor thermal transport properties of nanowires. This is supported by the red shift at higher pump powers observed in FIG. 7, consistent with a previous report where laser-induced produced redshifts in GaN nanowires during PL experiments. See H. W. Li et al., *Adv. Mater.* 18, 216 (2006).

Figure 9:
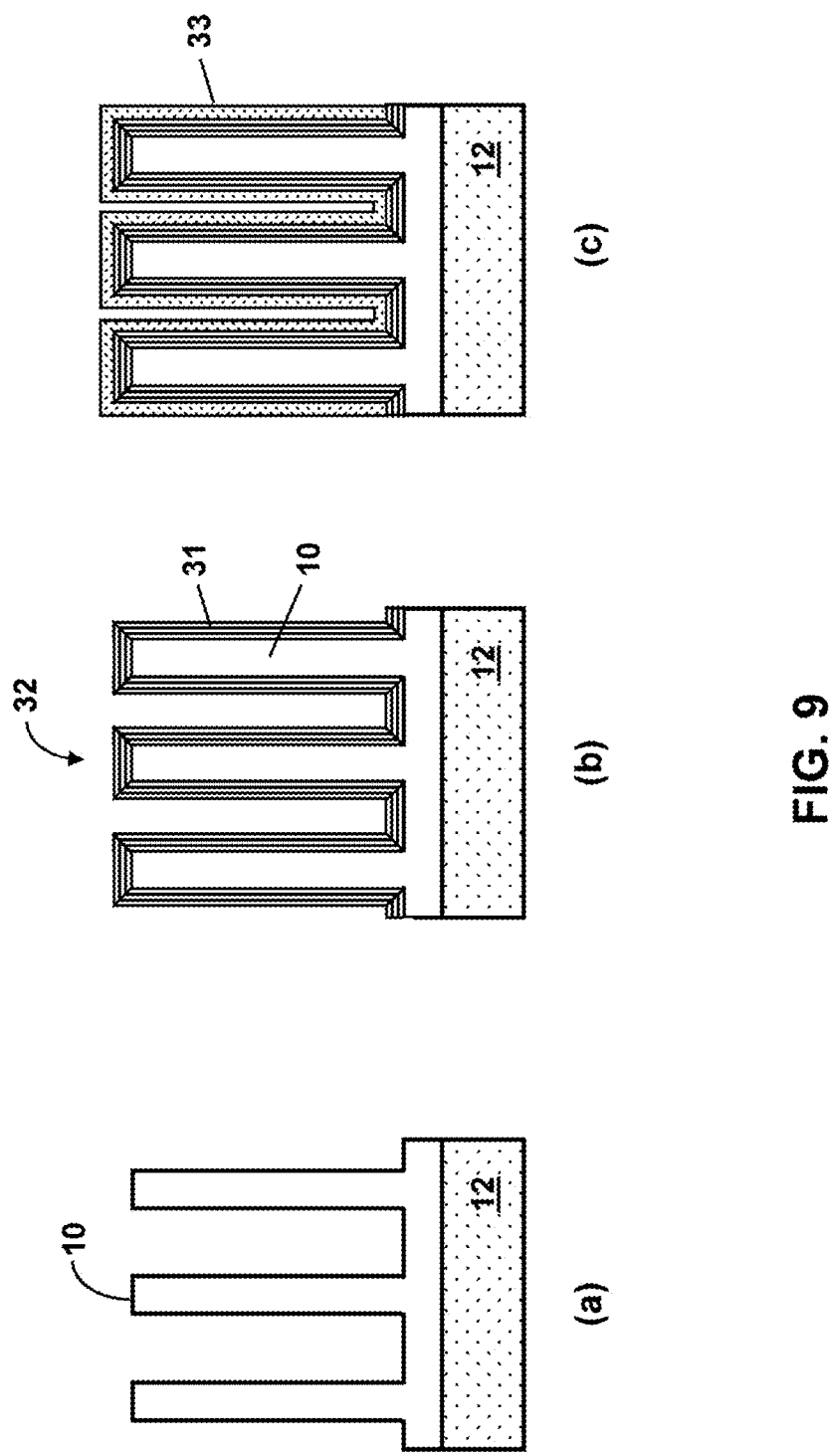
FIG. 9 is a schematic illustration of a method to fabricate a hybrid core-shell structure with (a) top-down formed core nanowires, (b) nanowires completed through the shell layer growth, and (c) the completed structure with a top layer on the core-shell nanowires.

Another embodiment, shown in FIG. 9, is directed to a method for fabricating vertically aligned core-shell nanowires. First, an array of vertically aligned Group III-V nanowires is fabricated according to the method shown in FIG. 1, comprising providing a Group III-V layer on a substrate; coating the Group III-V layer with an etch mask; plasma etching the Group III-V layer through the etch mask to provide a semi-periodic array of tapered nanowires; and selectively wet etching the sidewalls of the tapered nanowires to provide an array of vertically aligned Group III-V nanowires 10 on the substrate 12, as shown in FIG. 9(a). As shown in FIG. 9(b), this embodiment further comprises growing a shell layer 31 comprising at least one Group III-V layer coaxially around each of the vertically aligned Group III-V nanowires 10 to provide an array of hybrid core-shell nanowire structures 32, as shown in FIG. 9(b). The method can further comprise growing a top layer 33 on the shell layers 31. In some embodiments, the top layer can coalesce on the top to form a continuous canopy layer that can electrically connect the tops and sides of the vertically aligned core-shell nanowires 32. For example, the Group III-V nanowires can comprise Group III-nitride nanowires. As described below, the Group III-nitride nanowires can comprise vertically aligned n-type GaN nanowires. The shell layer can comprise a coaxial Group III-nitride MQW structure, such as an InGaN/GaN- or GaN/AlGaN-based MQW structure. The canopy layer can comprise p-type InGaN. Alternatively, an inverted structure can comprise an array of vertically aligned p-type GaN nanowire cores surrounded by a Group III-nitride MQW shell layer and an n-type GaN canopy layer. Other Group III-nitride and Group III-V core-shell structures can also be used.

As an example of this embodiment, core n-type GaN nanowires were created by "top-down" fabrication starting with an n-GaN layer on a sapphire substrate using a colloidal silica mask creating a semi-periodic array with, for example, an average pitch of ~500 nm and ~900 nm height. Construction of the layer structure began with growing a ~4 μm thick GaN template layer on c-plane sapphire by metal-organic chemical vapor deposition in a reactor using a two-step approach and a delayed-recovery technique, yielding GaN with a threading dislocation density (TDDs) of $~7 \times 10^8$ cm$^{-2}$. See S. Nakamura, *Jpn. J. Applied Phys.* 30, L1705 (1991); and D. D. Koleske et al., *Appl. Phys. Lett.* 81, 1940 (2002). Next, the template was removed from the reactor and covered with a masking layer consisting of a hexagonally close-packed monolayer of self-assembled colloidal silica spheres formed in a Langmuir-Blodgett trough. See Q. Li et al., *Appl. Phys. Lett.* 94, 231105 (2009). The masked sample was then subjected to a Cl-based inductively coupled plasma (ICP) etch forming a semi-periodic array of vertically-aligned nanowires. The resulting nanowires were tapered with wider diameters at the base, have an average pitch of ~500 nm that is determined by the diameter of the colloidal silica spheres, and were uniform in height (~900 nm). The nanowires were then subject to an anisotropic KOH-based (AZ400K photoresist developer) wet etch that removed surface damage from the ICP etch and formed ~100 nm diameter cylindrically shaped nanowires. An array of nanowires formed in this way, but using a colloidal silica sphere diameter of ~1 μm, is shown in the scanning electron microscope (SEM) image of FIG. 10(a). Due to the faster wet etch rate of planes perpendicular to the Ga polar (0001) top facet, the resultant nanowire has micro-faceted sidewalls with preferred {10-10} m-plane exposed facets and a (0001) c-plane top facet. This "top-down" fabrication technique of the GaN nanowires has several advantages including: all the nanowires have the same height, subsequent growth is on defined crystal facets, and dry etch damage is removed. Interestingly, although the TDD is not zero as can be achieved in "bottom-up" grown nanowires, only about 5 percent or fewer of the nanowires have threading dislocations based on the TDD of the initial film and the nanowire diameter and pitch, as previously shown.

Following the top-down fabrication of the ordered n-type GaN nanowire array, the sample was returned to the reactor and shell layers are grown. For this example, an ~80 nm thick n-type GaN layer was first grown, followed by the absorbing shell layers consisting of a 15 nm thick $In_{0.015}Ga_{0.985}N$ layer at 870° C. and an eight period multiple quantum well (MQW) structure. The MQW consisted of ~4 nm thick $In_xGa_{1-x}N$ quantum wells, grown at 760° C., and ~10 nm thick Si-doped n-type GaN barriers. This was capped with ~8 nm of undoped GaN. During growth of the shell layers the formation of new semi-polar {10-11} facets occurs at the nanowire tip and base, resulting in the extinction of the top c-plane facet and creating nanowires with a pointed apex. The structure was completed by growth of a p-type $In_{0.015}Ga_{0.985}N$ "canopy" layer, grown at 870° C. Initially this layer grew on all facets of the nanowires, and then the layer coalesced and grew only on the top forming a continuous film that electrically connected the tops and sides of all the nanowires.

FIG. 10(b) shows a cross-sectional SEM image of the completed hybrid nanowire-film structure. The p-InGaN layer growth creates a coalesced canopy layer over the top portion of the nanowires, leaving embedded air voids between the nanowires (at the bottom), which can enhance light scattering and absorption within the structure. A top view of the p-InGaN surface is shown in the SEM image of FIG. 10(c). The surface is off-white in appearance and consists of a dense array of V-defects formed by the persistence and intersection of the {10-11} top facets of the nanowires after coalescence. This morphology is typical of thick, lower temperature growth of III-nitrides. See F. Scholz et al., phys. stat. sol (a) 180, 315 (2000). The colloidal silica etch mask creates nanowire arrays with some short range hexagonal ordering, which manifests in the regular hexagonal shaped topography of the p-InGaN surface seen in some areas, most notably at the upper right in FIG. 10(c). The nanowires are centered below the apexes of the faceted surface.

Figure 10:
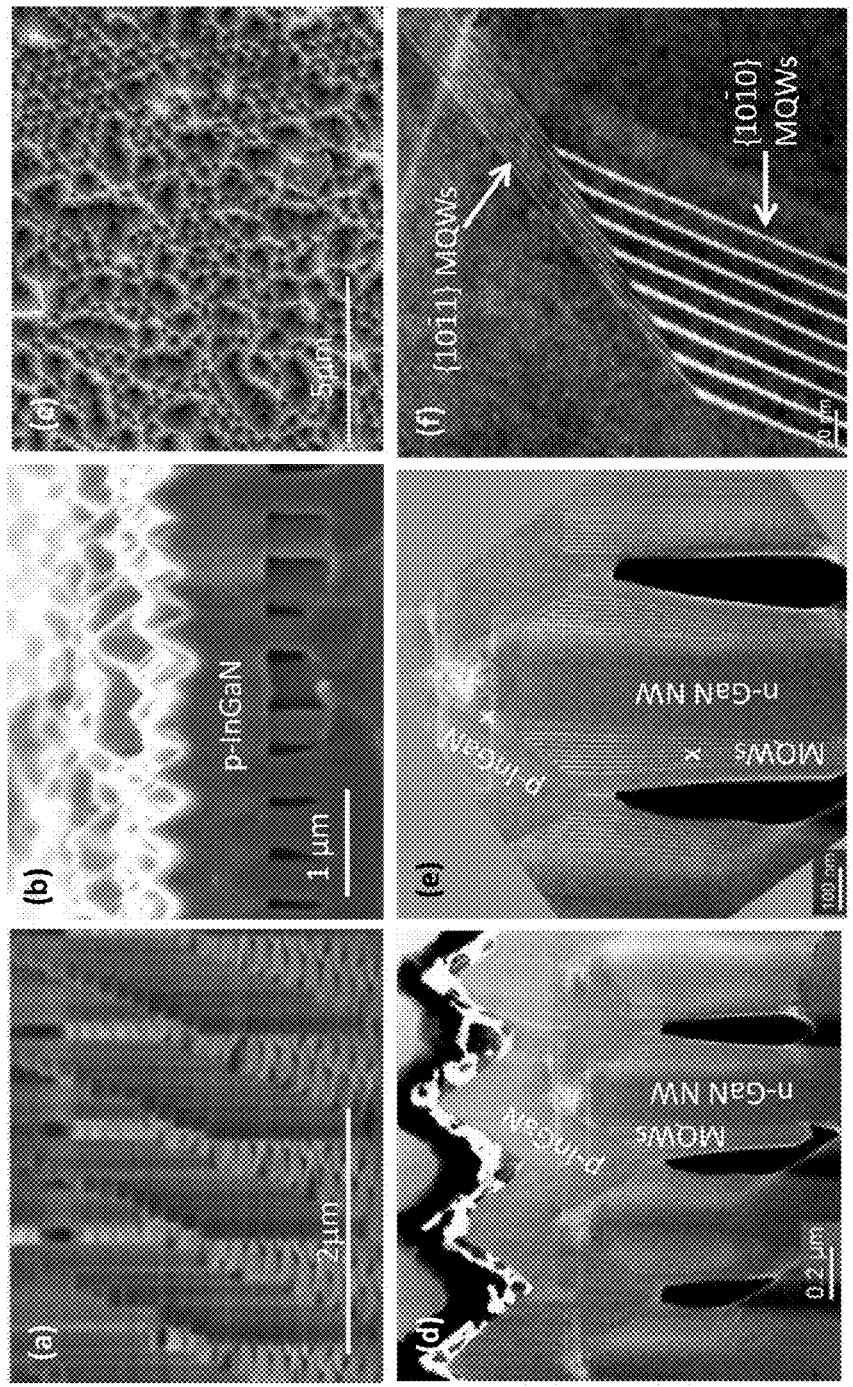
FIG. 10 are scanning electron microscope images of a) a representative nanowire array after dry and wet etching, b) a tilted cross-section of the completed III-nitride nanowire structure, and c) a top-view of the p-InGaN layer showing the faceted surface. Also shown are scanning transmission electron microscope images of d) a row of nanowires, e) a single nanowire, and f) a close-up of the semipolar and m-plane MQWs.

The nanowire structure was further revealed by cross-sectional scanning transmission electron microscopy (STEM) and energy dispersive x-ray spectroscopy (EDS). The STEM sample was prepared by focused ion beam milling where the MQWs in view in FIG. 10 are located on m-plane facets oriented perpendicular to the page. The cross-sectional STEM images in FIGS. 10(d) and 10(e) show the nanowires have a diameter of ~400 nm at a point halfway up the height of the nanowire, leaving ~100 nm spaces between nanowires. The MQWs grow on all of the exposed facets, and growth on the m-plane facets is faster than on the {10-11} facets as shown in the close-up image in FIG. 10(f). For the {10-11} facets the wells and barriers are each ~1.5 nm thick. The MQW thickness on the m-plane facets varies along the height of the nanowire. Non-uniform distribution in growth products along the height of the nanowire creates faster growth at the top of the m-plane sidewalls. At the top of the nanowire sidewalls the well and barrier thicknesses are ~2.5 nm and ~9 nm respectively. At the bottom of the nanowire sidewalls the MQW is thinner, and the innermost wells/barriers are thicker than the outermost wells/barriers. The innermost well/barrier is ~2.5 nm/5.5 nm thick while the outermost well/barrier is ~1.8 nm/3 nm thick. This change in MQW thickness at the bottom of the nanowire is due to reduced transport of gas phase reactants to the bottom-most parts of the nanowires as the opening between nanowires is pinched off at the top with increased nanowire diameters. EDS analysis reveals the indium incorporation in the $In_xGa_{1-x}N$ quantum wells is also different on the sidewall and apex facets with x~0.33 (±5%) appearing on the m-planes compared to x~0.22 (±5%) on the {10-11} planes with the measurement locations marked with x's in FIG. 10(e). The difference in indium composition on the two different planes has also been observed in planar material. See H. Yamada et al., Appl. Phys. Express 1, 041101 (2008). The m-plane nanowire facets shown here have a higher indium composition when compared to the same InGaN growth conditions performed on planar c-plane GaN. This allows for higher InGaN growth temperatures at a given indium composition compared to c-plane which should result in better InGaN material quality by avoiding defect formation that can occur at lower growth temperatures. See D. D. Koleske et al., J. Crystal Growth 242, 55 (2001); and X. U. Wu, Appl. Phys. Lett. 72, 692 (1998). The last important structural characteristic shown in the STEMs is the p-InGaN layer extends down along the nanowire sidewalls, allowing for the capture of current generated in the m-plane MQWs. This structure can be used to provide a nanowire solar cell or a nanowire-based light-emitting diode.

The present invention has been described as a method of fabricating vertically-aligned Group III-V micro- and nanowires. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method of fabricating vertically aligned Group III-nitride nanowires, comprising:
   providing a c-plane Group III-nitride substrate, or at least one c-plane Group III-nitride layer on a growth substrate;
   coating the top surface of the c-plane Group III-nitride substrate or the at least one c-plane Group III-nitride layer with an etch mask;
   anisotropically etching the c-plane Group III-nitride substrate or the at least one c-plane Group III-nitride layer through the etch mask to provide an array of c-axis oriented nanowires; and
   selectively wet etching the sidewalls of the c-axis oriented nanowires to remove anisotropic etch damage and provide an array of vertically aligned Group III-nitride nanowires.

2. The method of claim 1, wherein the growth substrate comprises sapphire, silicon, germanium, copper, silicon carbide, GaN, AlN, ZnO, or GaAs.

3. The method of claim 1, wherein the etch mask comprises a hexagonally close-packed silica colloid monolayer or a lithographically patterned dielectric or metal layer.

4. The method of claim 1, wherein the at least one c-plane Group-III nitride layer comprises c-plane GaN, AlN, AlGaN, InN, InGaN, AlInN, or AlInGaN that is undoped, n-type doped, or p-type doped.

5. The method of claim 1, wherein the cross-sectional dimension of the vertically aligned Group III-nitride nanowires is less than 100 microns.

6. The method of claim 5, wherein the cross-sectional dimension of the vertically aligned Group III-nitride nanowires is less than 1 micron.

7. The method of claim 1, wherein the at least one c-plane Group III-nitride layer comprises a planar heterostructure.

8. A method of fabricating vertically aligned Group III-nitride nanowires, comprising:
   providing at least one Group III-nitride layer on a growth substrate;
   coating the top surface of the at least one Group III-nitride layer with an etch mask;
   anisotropically etching the at least one Group III-nitride layer through the etch mask to provide an array of nanowires; and
   selectively wet etching the sidewalls of the nanowires to remove anisotropic etch damage and provide an array of vertically aligned Group III-nitride nanowires;
   wherein the at least one Group III-nitride layer comprises a planar heterostructure and wherein the planar heterostructure comprises a light-emitting diode, solar cell or laser structure.

9. The method of claim 8, wherein the planar heterostructure comprises a base n-type layer, a planar multiple quantum well structure on the base n-type layer, and a top p-type layer on the multiple quantum well structure.

10. The method of claim 9, wherein the base n-type layer comprises n-type GaN and the top p-type layer comprises p-type GaN or p-type InGaN.

11. The method of claim 10, further comprising an InGaN underlayer between the base n-type GaN layer and the multiple quantum well structure.

12. The method of claim 8, wherein the planar heterostructure comprises a base p-type layer, a planar multiple quantum well structure on the base p-type layer, and a top n-type layer on the multiple quantum well structure.

13. The method of claim 12, wherein the base p-type layer comprises p-type GaN and the top n-type layer comprises n-type GaN or n-type InGaN.

14. The method of claim 13, further comprising an InGaN underlayer between the base p-type GaN layer and the multiple quantum well structure.

15. The method of claim 9 or 12, wherein the multiple quantum well structure comprises a GaN/InGaN- or GaN/AlGaN-based multiple quantum well structure.

16. The method of claim 1, further comprising laterally growing a shell layer comprising at least one Group III-nitride layer coaxially around each of the vertically aligned Group III-nitride nanowires to provide an array of hybrid core-shell structures.

17. The method of claim 16, wherein the shell layer comprises a radially grown light emitting diode, solar cell or laser structure.

18. The method of claim 16, wherein the shell layer comprises a coaxial Group III-nitride multiple quantum well structure.

19. The method of claim 18, further comprising growing a top layer on the shell layer.

20. The method of claim 19, wherein the top layer coalesces on the top to form a continuous canopy layer that electrically connects the tops and sides of the vertically aligned Group III-nitride nanowires.

21. The method of claim 19, wherein the vertically aligned Group III-nitride nanowires are n-type and the top layer is p-type.

22. The method of claim 21, wherein the vertically aligned Group III-nitride nanowires comprise n-type GaN nanowires.

23. The method of claim 21, wherein the shell layer comprises a GaN/InGaN- or GaN/AlGaN-based multiple quantum well structure.

24. The method of claim 21, wherein the top layer comprises p-type InGaN.

25. The method of claim 23, further comprising an InGaN underlayer between the n-type GaN nanowire and the GaN/InGaN- or GaN/AlGaN-based multiple quantum well structure.

26. The method of claim 7, wherein the planar heterostructure comprises a light-emitting diode, solar cell, or laser structure.

27. The method of claim 26, wherein the planar heterostructure comprises a base n-type layer, a planar multiple quantum well structure on the base n-type layer, and a top p-type layer on the multiple quantum well structure.

28. The method of claim 27, wherein the base n-type layer comprises n-type GaN and the top p-type layer comprises p-type GaN or p-type InGaN.

29. The method of claim 28, further comprising an InGaN underlayer between the base n-type GaN layer and the multiple quantum well structure.

30. The method of claim 26, wherein the planar heterostructure comprises a base p-type layer, a planar multiple quantum well structure on the base p-type layer, and a top n-type layer on the multiple quantum well structure.

31. The method of claim 30, wherein the base p-type layer comprises p-type GaN and the top n-type layer comprises n-type GaN or n-type InGaN.

32. The method of claim 31, further comprising an InGaN underlayer between the base p-type GaN layer and the multiple quantum well structure.

33. The method of claim 28, wherein the multiple quantum well structure comprises a GaN/InGaN- or GaN/AlGaN-based multiple quantum well structure.

34. The method of claim 30, wherein the multiple quantum well structure comprises a GaN/InGaN- or GaN/AlGaN-based multiple quantum well structure.

\* \* \* \* \*